United States Patent
Barak et al.

(10) Patent No.: US 10,606,971 B2
(45) Date of Patent: Mar. 31, 2020

(54) TESTING NETLISTS BASED ON SINGULAR INDEPENDENT SIGNALS

(71) Applicant: INTERNATIONAL BUSINESS MACHINES CORPORATION, Armonk, NY (US)

(72) Inventors: Erez Barak, Hod Hasharon (IL); Shlomit Koyfman, Armonim (IL); Shiri Moran, Kiryat Tivon (IL); Ido Rozenberg, Rishon le-Zion (IL); Osher Yifrach, Modin (IL)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 5 days.

(21) Appl. No.: 15/825,138

(22) Filed: Nov. 29, 2017

(65) Prior Publication Data
US 2019/0163600 A1    May 30, 2019

(51) Int. Cl.
G06F 17/50    (2006.01)
G06F 11/34    (2006.01)
G01R 31/3183  (2006.01)
G06F 13/24    (2006.01)

(52) U.S. Cl.
CPC ..... G06F 17/504 (2013.01); G01R 31/31835 (2013.01); G06F 11/3466 (2013.01); G06F 17/5022 (2013.01); G06F 13/24 (2013.01); G06F 2201/86 (2013.01)

(58) Field of Classification Search
CPC .. G06F 17/504; G06F 11/348; G06F 11/3466; G06F 21/55; G06F 2201/86; G06F 2201/885; G06F 13/24; G06F 17/5022; G01R 31/31835
See application file for complete search history.

(56) References Cited

U.S. PATENT DOCUMENTS

| | | | | |
|---|---|---|---|---|
| 5,465,216 A | * | 11/1995 | Rotem | G06F 17/504 716/103 |
| 6,182,258 B1 | * | 1/2001 | Hollander | G01R 31/31704 714/739 |
| 6,536,031 B2 | * | 3/2003 | Ito | G06F 17/5022 716/103 |
| 6,581,191 B1 | * | 6/2003 | Schubert | G01R 31/318357 703/14 |

(Continued)

FOREIGN PATENT DOCUMENTS

WO    2017019824 A1    2/2017

OTHER PUBLICATIONS

Texas Instruments "Trace Analyser User's Guide" Mar. 2014; pp. 102.

*Primary Examiner* — Naum Levin
(74) *Attorney, Agent, or Firm* — Cantor Colburn LLP; William Kinnaman (57) ABSTRACT

Examples of techniques for modifying testing tools are described herein. An example computer-implemented method includes receiving, via a processor, a netlist comprising a complex coverage event that depends on a singular independent signal. The method includes detecting, via the processor, that complex coverage event can be separated into the singular independent signal and a logic state based on a structural logic analysis. The method also includes modifying, via the processor, a testing tool to test the netlist based on the singular independent signal.

20 Claims, 6 Drawing Sheets

(56) References Cited

U.S. PATENT DOCUMENTS

| | | | | |
|---|---|---|---|---|
| 7,139,988 B2* | 11/2006 | Chard | ............... | G06F 17/5022 |
| | | | | 716/108 |
| 7,197,445 B1* | 3/2007 | Deepak | ............... | G06F 17/5022 |
| | | | | 703/14 |
| 7,698,118 B2* | 4/2010 | Reblewski | ............ | G06F 17/5022 |
| | | | | 326/38 |
| 8,271,918 B2* | 9/2012 | Kwok | ............... | G06F 17/504 |
| | | | | 703/16 |
| 8,490,046 B2 | 7/2013 | Bhinge | | |
| 8,499,266 B2* | 7/2013 | Chan | ............... | G06F 17/5031 |
| | | | | 716/106 |
| 8,615,619 B2 | 12/2013 | Dewitt, Jr. et al. | | |
| 8,782,592 B2* | 7/2014 | Mansouri | ............ | G06F 17/5022 |
| | | | | 716/106 |
| 9,268,889 B2* | 2/2016 | Meil | ............... | G06F 17/5031 |
| 9,529,614 B2 | 12/2016 | Lin et al. | | |
| 9,529,697 B1 | 12/2016 | Aldrich et al. | | |
| 10,204,200 B2 | 2/2019 | Sattiraju | | |
| 10,325,046 B2 | 6/2019 | Liu et al. | | |
| 10,331,831 B2 | 6/2019 | Darbari et al. | | |
| 2004/0193393 A1* | 9/2004 | Keane | ............... | G06F 17/5009 |
| | | | | 703/16 |
| 2009/0271165 A1* | 10/2009 | Averill | ............... | G06F 17/5022 |
| | | | | 703/13 |
| 2011/0161898 A1* | 6/2011 | Chauhdry | ............ | G06F 17/504 |
| | | | | 716/103 |
| 2015/0312093 A1* | 10/2015 | Woloschek | ............ | H04L 49/25 |
| | | | | 370/254 |
| 2017/0169149 A1* | 6/2017 | Kailas | ............... | G06F 17/5036 |

\* cited by examiner

TESTING NETLISTS BASED ON SINGULAR INDEPENDENT SIGNALS

BACKGROUND

The present techniques relate to circuit design. More specifically, the techniques relate to performing verification of circuit design.

SUMMARY

According to an embodiment described herein, a system can include processor to receive a netlist comprising a complex coverage event that depends on at least one singular independent signal. The processor can also further detect that the complex coverage event can be separated into the singular independent signal and a logic state based on a structural logic analysis. The processor can also modify a testing tool to test the netlist based on the singular independent signal.

According to another embodiment described herein, a method can include receiving, via a processor, a netlist comprising a complex coverage event that depends on a singular independent signal. The method can further include detecting, via the processor, that complex coverage event can be separated into the singular independent signal and a logic state based on a structural logic analysis. The method can also further include. The method can also include modifying, via the processor, a testing tool to test the netlist based on the singular independent signal.

According to another embodiment described herein, a computer program product for simulating hard-to-hit events can include computer-readable storage medium having program code embodied therewith. The computer readable storage medium is not a transitory signal per se. The program code executable by a processor to cause the processor to receive a netlist comprising a complex coverage event that depends on a singular independent signal. The program code can also cause the processor to detect that complex coverage event can be separated into the singular independent signal and a logic state based on a structural logic analysis. The program code can also cause the processor to modify a testing tool to test the netlist based on the singular independent signal.

DETAILED DESCRIPTION

Electronic design automation (EDA) tools are used to evaluate chip designs prior to fabrication. The EDA process may generally include two steps. The first step can be a check of the register transfer level (RTL) design logic. The second step can be a creation of a physical circuit design from the RTL design. The first step, checking the design logic, can be referred to as RTL design checking. In RTL design checking, a language such as VHDL (VHSIC Hardware Description Language) or Verilog can be used to describe and model the logical behavior of a circuit. In some cases, a circuit design can be stored as a graph, the edges of which correspond to wires and the nodes of which correspond to circuit components. These edges are referred herein to as nets, and the set of all elements that make up the graph are referred herein as a netlist. RTL design checking may also include two steps. A first step can be static checking and the second step can be verification, also referred to as dynamic checking. In static checking, the structure of the design can be analyzed without simulating the behavior of the design. By contrast, in verification, the design can be simulated by applying test patterns or stimuli to the inputs of the design to identify possible errors. Verification may also include a mathematical analysis of the state space of the design, referred to as formal verification or model checking. Model checking can be used to apply a subset of all possible stimuli to the inputs of the design.

Thus, pre-silicon verification may be used to validate a model of a processor or other hardware at various levels of abstraction from an architectural specification to a gate-level netlist. For example, in the pre-silicon phase, a simulation may be run on both VHDL code and verification code. However, in some cases, the simulation of some events during model checking may depend on the driving of singular independent signals at particular clock cycles. Thus, there may be some coverage events that are unhittable or hard-to-hit using traditional simulation. For example, the singular independent signals may include asynchronous interface signals. As used herein, an asynchronous interface signal is a single-bit input that represents a rare, irregular event. For example, the asynchronous interface signal may not be synchronized to any controlling clock. In some examples, the asynchronous interface signal may correspond to an asynchronous interrupt input from an input device, such as a mouse, keyboard, etc. Over-driving asynchronous interface signals during simulation of a model may have a disruptive effect on normal function testing. For example, such an over-driving of asynchronous signals may result in reduced coverage or under-driving of simulation in other areas of a design. Therefore, the driving of asynchronous interface signals may be minimized to reduce the disruptive effect. Asynchronous coverage events may thus be particularly difficult due to the disruptive nature of asynchronous interrupts that can prevent the rarely covered cases from occurring. An asynchronous coverage event, as used herein, is a coverage event that requires an asynchronous input signal to be high prior to the sim cycle when the event is hit. Such asynchronous coverage events may be hard to hit, since during most of the simulation time the asynchronous input signal is low. For example, the asynchronous input signal may be low to avoid unnecessary recovery during the test. Complex coverage events may be a combination of asynchronous coverage events that cover dedicated hardware logic. For example, such dedicated hardware logic may be included in a processor to handle special use cases such as division by zero. The complex coverage events may include hard-to-hit coverage events that may be particularly hard-to-hit because they include activation of a rarely-covered dedicated hardware logic and an asynchronous interface signal that has an effect on the dedicated hardware logic. Because the dedicated hardware logic may be rarely used and asynchronous interface signals may be rarely driven, the combination of these two hard-to-hit coverage events may be particularly difficult to simulate, or hard-to-hit.

According to embodiments of the present disclosure, a system including a processor can receive a netlist including a complex coverage event that depends on at least one singular independent signal. The singular independent signal may be, for example, an asynchronous input signal, such as an interrupt corresponding to a mouse click, keyboard typing, etc. The complex coverage event may cover a simultaneous occurrence of a rare hardware event and a singular independent signal. The processor can detect that the complex coverage event can be separated into the singular independent signal and a logic state based on a structural logic analysis. The logic state may indicate that a particular scenario has occurred. For example, the scenario may be some operation of a dedicated hardware logic. The processor can further modify a testing tool to test the netlist based on the singular independent signal. For example, the processor can separate the singular independent signal from the logic state in the complex coverage event to generate a partial coverage event including the logic state. The processor can determine an operation window in which the singular independent signal effects the complex coverage event based on the partial coverage event. The processor can then modify the testing tool to drive the singular independent signal at the operation window to simulate the complex coverage event. Thus, embodiments of the present disclosure enable coverage of hard-to-hit events by driving singular independent signals at particular operation windows for each hard-to-hit event. The techniques described herein thus reduce simulation time used to simulate models. For example, rather than randomly driving signals, the signals can be driven only when they are used to simulate a particular hard-to-hit event.

Figure 1:
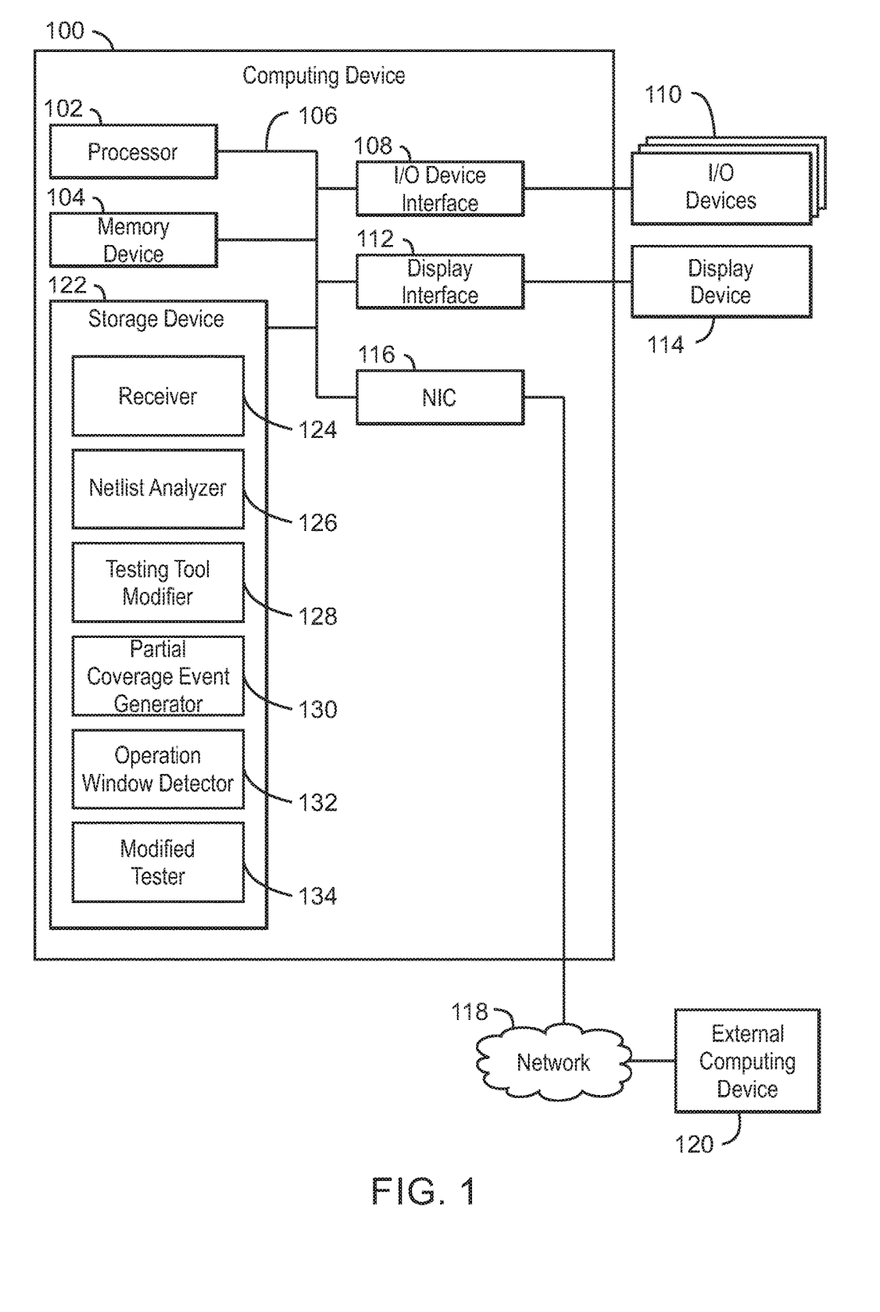
FIG. 1 is a block diagram of an example computing device that can identify singular independent signals using structural logic analysis.

With reference now to FIG. 1, an example computing device can identify singular independent signals using structural logic analysis. The computing device 100 may be for example, a server, desktop computer, laptop computer, tablet computer, or smartphone. In some examples, computing device 100 may be a cloud computing node. Computing device 100 may be described in the general context of computer system executable instructions, such as program modules, being executed by a computer system. Generally, program modules may include routines, programs, objects, components, logic, data structures, and so on that perform particular tasks or implement particular abstract data types. Computing device 100 may be practiced in distributed cloud computing environments where tasks are performed by remote processing devices that are linked through a communications network. In a distributed cloud computing environment, program modules may be located in both local and remote computer system storage media including memory storage devices.

The computing device 100 may include a processor 102 that is to execute stored instructions, a memory device 104 to provide temporary memory space for operations of said instructions during operation. The processor can be a single-core processor, multi-core processor, computing cluster, or any number of other configurations. The memory 104 can include random access memory (RAM), read only memory, flash memory, or any other suitable memory systems.

The processor 102 may be connected through a system interconnect 106 (e.g., PCI®, PCI-Express®, etc.) to an input/output (I/O) device interface 108 adapted to connect the computing device 100 to one or more I/O devices 110. The I/O devices 110 may include, for example, a keyboard and a pointing device, wherein the pointing device may include a touchpad or a touchscreen, among others. The I/O devices 110 may be built-in components of the computing device 100, or may be devices that are externally connected to the computing device 100.

The processor 102 may also be linked through the system interconnect 106 to a display interface 112 adapted to connect the computing device 100 to a display device 114. The display device 114 may include a display screen that is a built-in component of the computing device 100. The display device 114 may also include a computer monitor, television, or projector, among others, that is externally connected to the computing device 100. In addition, a network interface controller (NIC) 116 may be adapted to connect the computing device 100 through the system interconnect 106 to the network 118. In some embodiments, the NIC 116 can transmit data using any suitable interface or protocol, such as the Internet small computer system interface, among others. The network 118 may be a cellular network, a radio network, a wide area network (WAN), a local area network (LAN), or the Internet, among others. An external computing device 120 may connect to the computing device 100 through the network 118. In some examples, external computing device 120 may be an external webserver 120. In some examples, external computing device 120 may be a cloud computing node.

The processor 102 may also be linked through the system interconnect 106 to a storage device 122 that can include a hard drive, an optical drive, a USB flash drive, an array of drives, or any combinations thereof. In some examples, the storage device may include a receiver 124, a netlist analyzer 126, a testing tool modifier 128, a partial coverage event generator 130, an operation window detector 132, and a modified tester 134. The receiver 124 can receive a netlist including a complex coverage event that depends on at least one singular independent signal. For example, the singular independent signal may be an asynchronous interface signal. In some examples, the singular independent signal may be an interrupt. The netlist analyzer 126 can detect that the complex coverage event can be separated into the singular independent signal and a logic state based on a structural logic analysis. In some examples, structural logic analysis can include determining a number of paths for each signal received at a counter and identifying signals with more than one path as part of the logic state. For example, signals with only one path may be identified as singular independent signals. In some examples, the netlist analyzer 126 can detect that the complex coverage event can be separated into a number of singular independent signals including the singular independent signal and a logic state based on the structural logic analysis. The testing tool modifier 128 can then modify a testing tool to test the netlist based on the singular independent signal. The partial coverage event generator 130 can separate the singular independent signal from the logic state in the complex coverage event to generate a partial coverage event including the logic state. In some examples, the partial coverage event generator 130 can separate a number of singular independent signals from the logic state in the complex coverage event to generate a partial coverage event including the logic state. The operation window detector 132 can determine an operation window in which the singular independent signal effects the complex coverage event based on the partial coverage event. In some examples, the operation window detector 132 can determine one or more operation windows in which the plurality of singular independent signals effect the complex coverage event based on the partial coverage event. The modified tester 134 can drive the singular independent signal at the operation window to simulate the complex coverage event. In some examples, the modified tester 134 can drive the plurality of singular independent signals at the one or more operation windows to simulate the complex coverage event. In some examples, if the netlist satisfies one or more predetermined characteristics during testing, a circuit design corresponding to the netlist can be transmitted to a fabrication device for manufacturing a circuit based on the netlist.

It is to be understood that the block diagram of FIG. 1 is not intended to indicate that the computing device 100 is to include all of the components shown in FIG. 1. Rather, the computing device 100 can include fewer or additional components not illustrated in FIG. 1 (e.g., additional memory components, embedded controllers, modules, additional network interfaces, etc.). Furthermore, any of the functionalities of the receiver 124, the netlist analyzer 126, the testing tool modifier 128, the partial coverage event generator 130, the operation window detector 132, and the modified tester 134, may be partially, or entirely, implemented in hardware and/or in the processor 102. For example, the functionality may be implemented with an application specific integrated circuit, logic implemented in an embedded controller, or in logic implemented in the processor 102, among others. In some embodiments, the functionalities of the receiver 124, the netlist analyzer 126, the testing tool modifier 128, the partial coverage event generator 130, the operation window detector 132, and the modified tester 134 can be implemented with logic, wherein the logic, as referred to herein, can include any suitable hardware (e.g., a processor, among others), software (e.g., an application, among others), firmware, or any suitable combination of hardware, software, and firmware.

Figure 2:
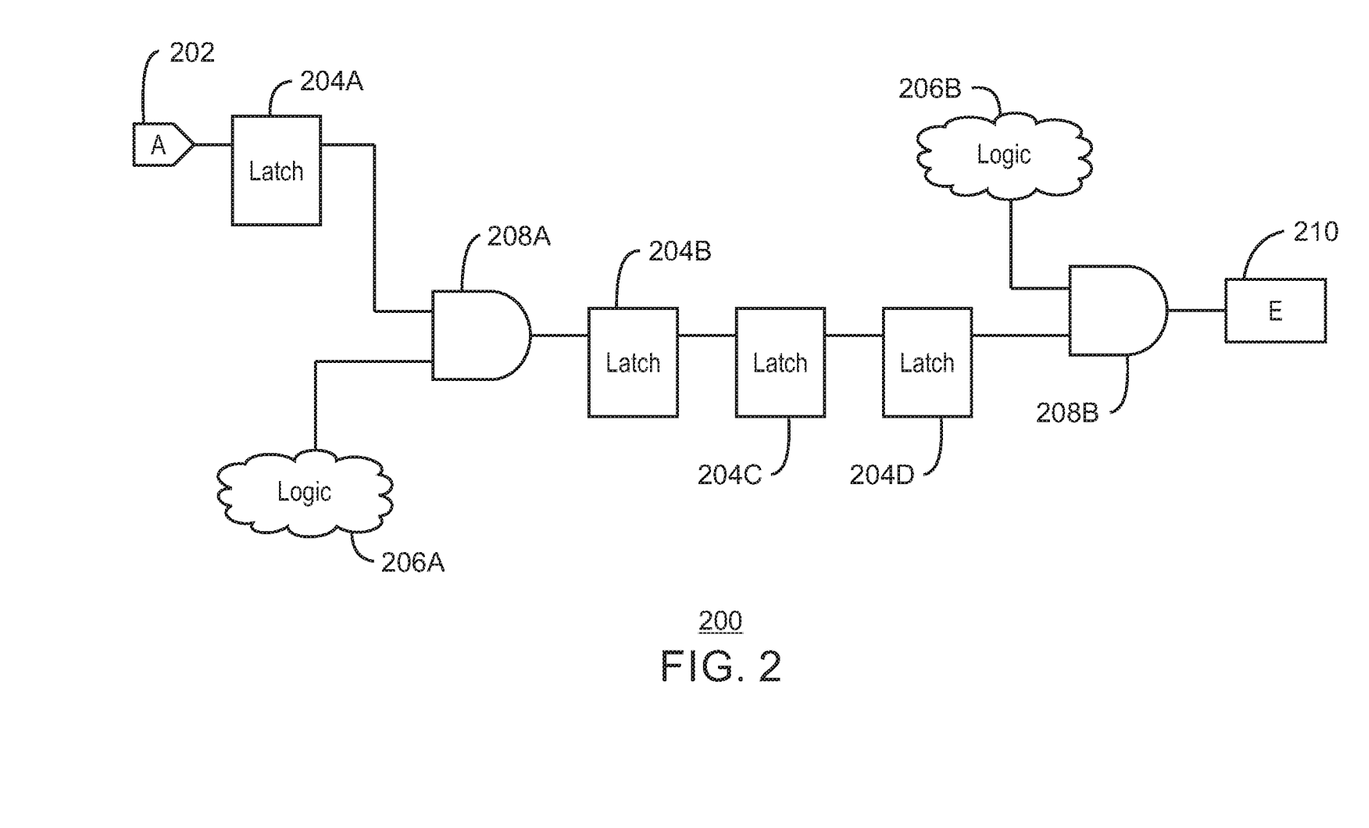
FIG. 2 is a block diagram of an example complex coverage event including a singular independent signal.

FIG. 2 is a block diagram of an example complex coverage event including a singular independent signal. The example complex coverage event of FIG. 2 is generally referenced using reference number 200 and can be received and analyzed using the receiver 124 and netlist analyzer 126 of FIG. 1 above, or the receiver module 606 and netlist analyzer module 608 of FIG. 6 below.

As shown in FIG. 2, the example complex coverage event 200 includes a singular independent signal 202 "A". For example, the singular independent signal 202 may be a delayed representation of an asynchronous interface signal. The example complex coverage event 200 also includes a number of latches 204A, 204B, 204C, and 204D. The example complex coverage event 200 further includes logic clouds 206A and 206B. The example complex coverage event 200 further includes AND gates 208A and 208B. The example complex coverage event 200 also includes an event counter 210 "E".

In the example complex coverage event 200, a singular independent signal 202 can be detected in the presence of particular states of logic clouds 206A and 206B to increment the counter 210. For example, latches 204A, 204B, 204C, and 204D may be used to represent a particular clock cycle delay for the singular independent signal 202. In some examples, the latches 204A, 204B, 204C, and 204D, the logic clouds 206A and, 206B, and the AND gates 208A and 208B can be considered a particular scenario or logic state. The event counter 210 may increment to indicate a detected event E each time the scenario is detected with a properly timed singular independent signal 202. For example, the event E may be a hard-to-hit event including a rare scenario of a dedicated hardware logic being activated with a properly timed singular independent signal 202. For example, the singular independent signal 202 may be detected as occurring simultaneously, adjacently successively, or within a window of time of the dedicated hardware logic being activated. In some examples, the logic state may be separated from the singular independent signal 202 to generate a partial coverage event E' as discussed with respect to FIG. 5 below. For example, the event counter 210 may be split into two counters, with a separate counter for the singular independent signal 202 and the logic state representing partial coverage event E'. The separate counter for the logic state E' may be used in a simulation to identify cases where the logic state indicates that a partial coverage event E' has occurred. For example, after running a simulation, a report may include which counters were incremented, the amount each counter was incremented, and the timing in which the counters were incremented. The identified cases of detected partial coverage event E' can then be used to drive the singular independent signal 202 in a subsequent simulation in order to successfully simulate the complex coverage event E.

In one example, a processor design to be tested may include two cores. In some examples, one core of the processor may be designed to send a signal to the second core. For example, the signal sent from the first core may correspond to the singular independent signal 202. The signal may be, for example, an instruction not to send any loads or stores to memory for some specified number of cycles. In some examples, the singular independent signal 202 can be separated from the partial coverage event E' including logics 206A and 206B. The partial coverage event E' can be used to determine a window to drive the singular independent signal 202 during a subsequent simulation of the processor design.

It is to be understood that the block diagram of FIG. 2 is not intended to indicate that the example complex coverage event 200 is to include all of the components shown in FIG. 2. Rather, the example complex coverage event 200 can include fewer or additional components not illustrated in FIG. 2 (e.g., additional singular independent signals, latches, logic clouds, etc.).

Figure 3:
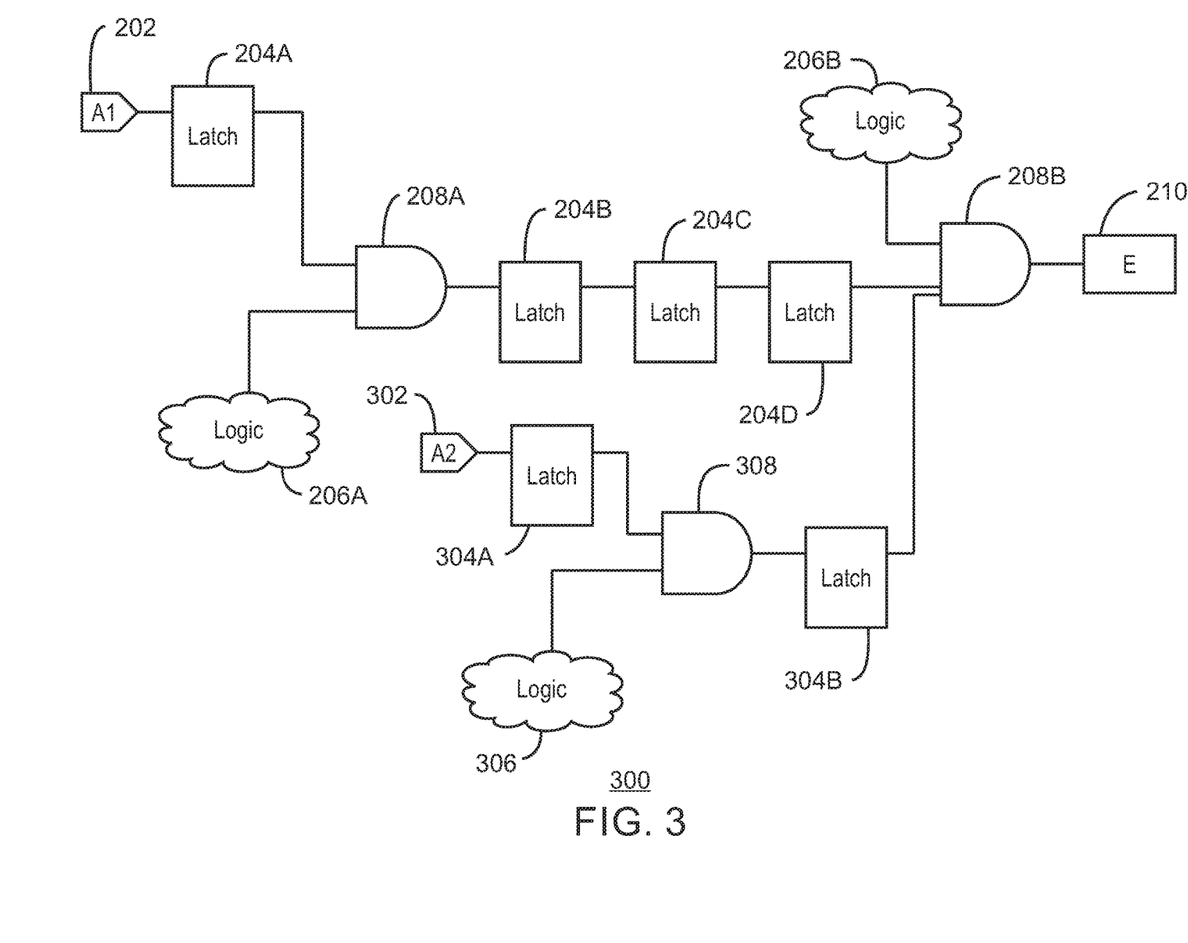
FIG. 3 is a block diagram of an example complex coverage event including multiple independent signals.

FIG. 3 is a block diagram of an example complex coverage event including multiple independent signals. The example complex coverage event of FIG. 3 is generally referenced using reference number 300 and can be received and analyzed using the receiver 124 and netlist analyzer 126 of FIG. 1 above, or the receiver module 606 and netlist analyzer module 608 of FIG. 6 below.

As shown in FIG. 3, the example complex coverage event 300 includes similarly number elements of FIG. 2 above. The example complex coverage event 300 further includes singular independent signal 302 "AT". The example complex coverage event 300 also further includes latches 304A and 304B. The example complex coverage event 300 further includes logic cloud 306. The example complex coverage event 300 further also includes AND gate 308.

In the example complex coverage event 300, the output of the additional signal 302 and corresponding latches 304A and 304B, logic cloud 306, and the AND gate 308 may be an additional input into the AND gate 208B. In the example complex coverage event 300, the event counter 210 may increment to indicate a detected event E each time both independent signals 202 and 302 and a particular scenario of the latches 204A, 204B, 204C, 204D, 304A, 304B, the logic clouds 206A, 206B, 306, and the AND gates 208A and 308, results in a predetermined output from AND gate 208B. For example, the event E may be a hard-to-hit event including a rare scenario occurring with a properly timed singular independent signals 202 and 302. In some examples, a partial coverage event E' may be generated by separating the singular independent signals 202 and 302 and including logic clouds 206A, 206B, and 306 in the partial coverage event E'.

In another example, a processor design may include three cores. For example, two of the cores may be sending signals to a third core. The signals from the two cores may correspond to singular independent signals 202 and 302. In some examples, the singular independent signals 202 and 302 can be separated from the partial coverage event E' and then driven at appropriate windows based on testing of the partial coverage event E'.

It is to be understood that the block diagram of FIG. 3 is not intended to indicate that the example complex coverage event 300 is to include all of the components shown in FIG. 3. Rather, the example complex coverage event 300 can include fewer or additional components not illustrated in FIG. 3 (e.g., additional singular independent signals, latches, logic clouds, etc.).

Figure 4:
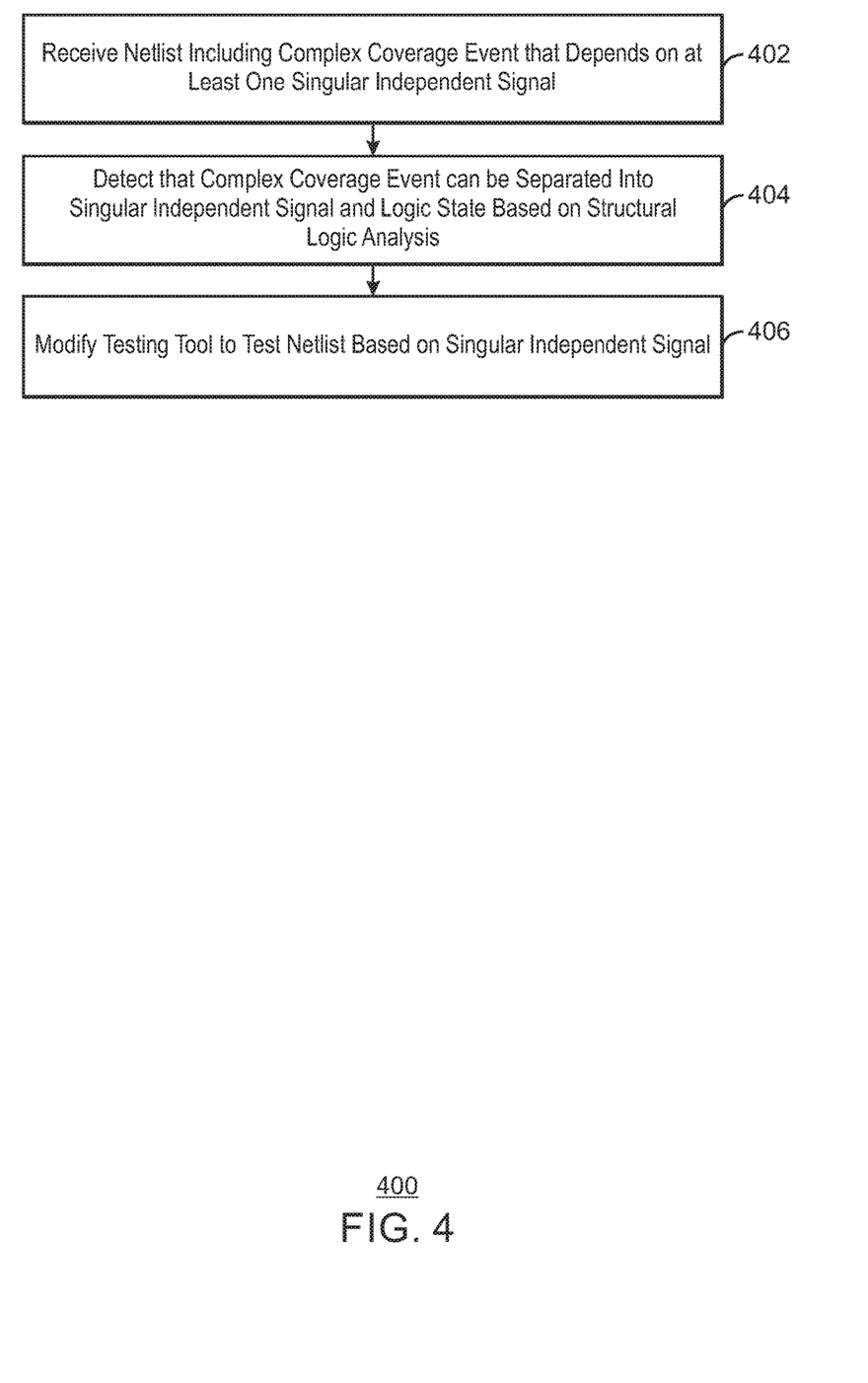
FIG. 4 is a block diagram of an example method that can identify and extract singular independent signals from a complex coverage event.

FIG. 4 is a process flow diagram of an example method that can identify and extract singular independent signals from a complex coverage event. The method 400 can be implemented with any suitable computing device, such as the computing device 100 of FIG. 1 and is described with reference to the example complex coverage events 200 and 300 of FIGS. 2 and 3. For example, the method 400 can be implemented by the netlist analyzer 126 via the processor 102 of the computing device 100 of FIG. 1 or the netlist analyzer module 608 via the processor 602 of FIG. 6.

At block 402, a processor receives a netlist including a complex coverage event that depends on at least one singular independent signal. For example, the singular independent signal may be an asynchronous interface signal, such as an interrupt. In some examples, the netlist may be in the form of a VHDL file. For example, the VHDL may be compiled to generate a model to perform a simulation of executing a particular signal with a circuit design.

At block 404, the processor detects that the complex coverage event can be separated into the singular independent signal and a logic state based on a structural logic analysis. In some examples, the processor can detect that the complex coverage event can be separated into a plurality of singular independent signals including the singular independent signal and a logic state based on the structural logic analysis. For example, a complex coverage event E may be a hard-to-hit coverage event that depends on two asynchronous interface signals occurring at one or more clock cycles. The processor can use structural analysis of the netlist to determine if E can be represented as L(A,n) and E', where n is a number of simulation cycles, A is an input, E' is a Boolean function independent of A, and L(A,n) is an n-cycle latched value of A. For example, the structural analysis can include performing a backward traversal from the given coverage events to inputs. The traversal may performed through AND gates and latches only. Then, for all found inputs, the processor may perform a forward traversal from an input to the coverage event. In some examples, if a different path is detected from the path received in the backward traversal, then the processor may skip the input. Otherwise, if the processor does not detect a different path, then the processor may store the input together with the number of latches in the path received in the backward traversal. Thus, the processor can determine a number of paths for each signal received at a counter and identify signals with more than one path as part of the logic state. The processor can identify signals with only one path as singular independent signals.

Figure 5:
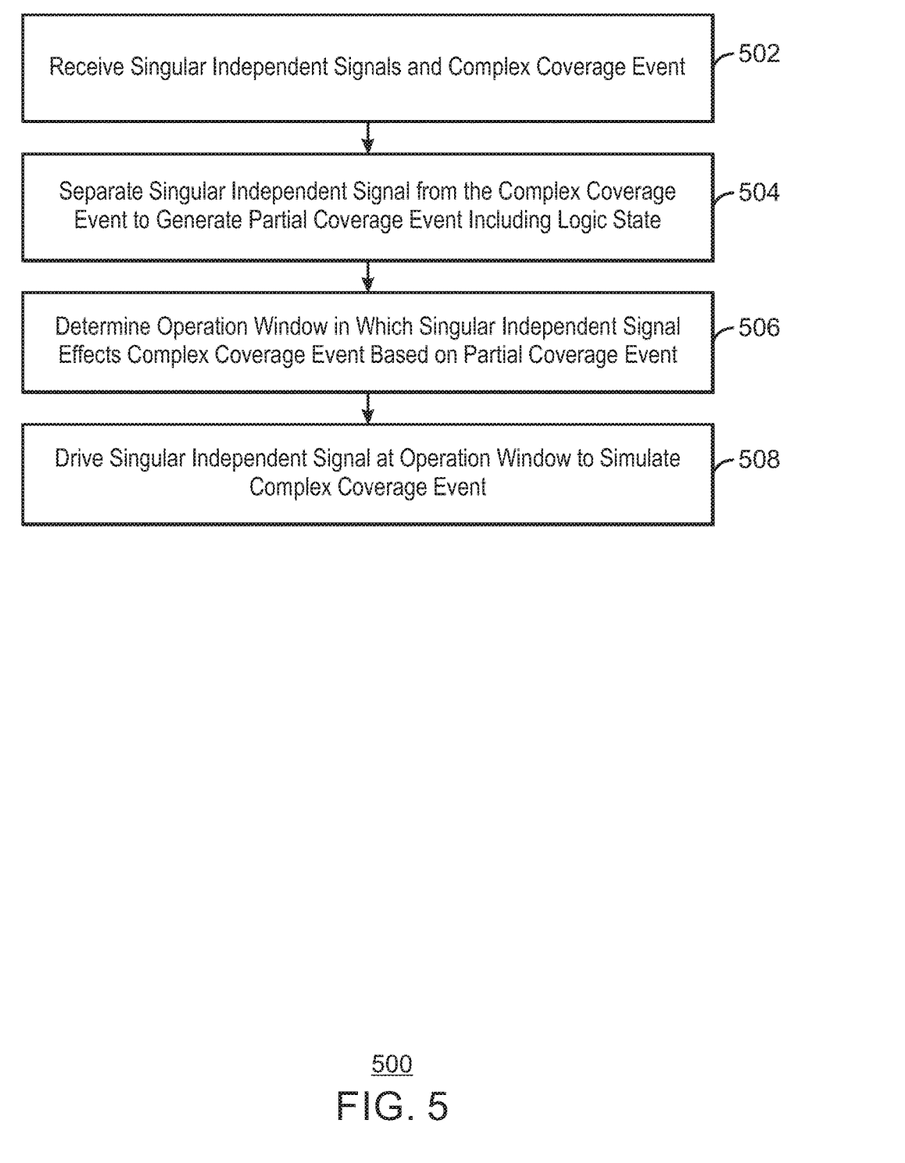
FIG. 5 is a block diagram of an example method that can simulate complex coverage events using driven singular independent signals.

At block 406, the processor modifies a testing tool to test the netlist based on the singular independent signal. For example, the testing tool can be modified to perform testing by driving the singular independent signal at an associated operation window according to the method 500 below.

The process flow diagram of FIG. 4 is not intended to indicate that the operations of the method 400 are to be executed in any particular order, or that all of the operations of the method 400 are to be included in every case. Additionally, the method 400 can include any suitable number of additional operations. For example, the processor can detect that the complex coverage event can be separated into a plurality of singular independent signals including the singular independent signal and a logic state based on the structural logic analysis.

FIG. 5 is a process flow diagram of an example method that can simulate complex coverage events using driven singular independent signals. The method 500 can be implemented with any suitable computing device, such as the computing device 100 of FIG. 1 and is described with reference to the example complex coverage events 200 and 300 of FIGS. 2 and 3. For example, the method 500 can be implemented by the processor 102 of the computing device 100 of FIG. 1 or the processor 602 of FIG. 6.

At block 502, a processor receives singular independent signals and a complex coverage event. For example, the singular independent signals may be identified using the method 400 above. In some examples, the complex coverage event may depend on one or more of the singular independent signals.

At block 504, the processor separates the singular independent signal from the logic state in the complex coverage event to generate a partial coverage event including the logic state. In some examples, the processor can separate the plurality of singular independent signals from the logic state in the complex coverage event to generate a partial coverage event including the logic state. For example, the processor may begin at an event counter E and analyze input signals of the counter. For example, the signals may include a FAN IN signal. The processor may then perform a search for each signal, to determine the elements that produced each signal, until the search reaches the asynchronous interface signal A. For each signal, the processor may determine different paths that the signal may have taken. If two or more paths are possible, then the processor can label the signal as not being an asynchronous interface signal. For example, the signal may rather be associated with a logic state, such as a state machine, or a part of a sequence of signals in a logic cloud.

At block 506, the processor determines an operation window in which the singular independent signal effects the complex coverage event based on the partial coverage event. In some examples, determining the operation window may include adding the partial coverage event into a test and rerunning a regression suite. If the partial coverage event is hit at a particular clock cycle k, then the test may be rerun while driving the singular independent signal to a high value of 1 at a clock cycle k-n. For example, given V1, V2, V3, . . . , Vk+n as the complete test vector (where Vm represent the logic state at cycle m), then the processor can rerun the first k-1 cycles (v1, v2, v3, . . . , vk-1). At the Vk cycle, the processor can maintain the same logic state as it had in the original run at cycle Vk excluding A, with A set to 1. The processor can then continue to run until the end of the test In some examples, the processor can determine one or more operation windows in which any number of singular independent signals effect the complex coverage event based on the partial coverage event. For example, the processor may determine that a first singular independent signal had a high value a first number of cycles back, while a second singular independent signal had a high value a second number of cycles back, in connection with a particular logic state included in the partial coverage event. In some examples, the processor can receive several inputs: L(A1, n1) and L(A2,n2) . . . and E'. Thus, instead of a single-bit input A, a Boolean function of several inputs may be used. For example, the processor can process several inputs E=L (A,n) and E', wherein E' is a Boolean function that is independent of A. In some examples, the processor may check the independency for the first n cycles only. For example, an event E' that uses dedicated logic to trigger may occur on a cycle n. In some examples, in order to find the independent logic event A that together with E' forms an event E, the processor may only need to look from cycle 0 to cycle n, since the window from cycle 0 to cycle n is where the cone of influence signals that cause E' to trigger may be found. Thus, the processor may determine one or more windows for any number of singular independent signals. For example, one singular independent signal may have a delay of a first number of cycles while a second singular independent signal may have an associated delay of a second number of cycles. The processor can determine a different operation window for each of the singular independent signals based on the associated delays.

At block 508, the processor drives the singular independent signal at the operation window to simulate the complex coverage event. In some examples, the processor can drive two or more independent signals at one or more operation windows to simulate the complex coverage event. In some examples, if the netlist satisfies one or more predetermined characteristics during testing, a circuit design corresponding to the netlist can be transmitted to a fabrication device for manufacturing a circuit based on the netlist.

The process flow diagram of FIG. 5 is not intended to indicate that the operations of the method 500 are to be executed in any particular order, or that all of the operations of the method 500 are to be included in every case. Additionally, the method 500 can include any suitable number of additional operations.

The present techniques may be a system, a method or computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present techniques may be assembler instructions, instruction-set-architecture (ISA) instructions, machine instructions, machine dependent instructions, microcode, firmware instructions, state-setting data, or either code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present techniques.

Aspects of the present techniques are described herein with reference to flowchart illustrations and/or block diagrams of methods, apparatus (systems), and computer program products according to embodiments of the techniques. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 6:
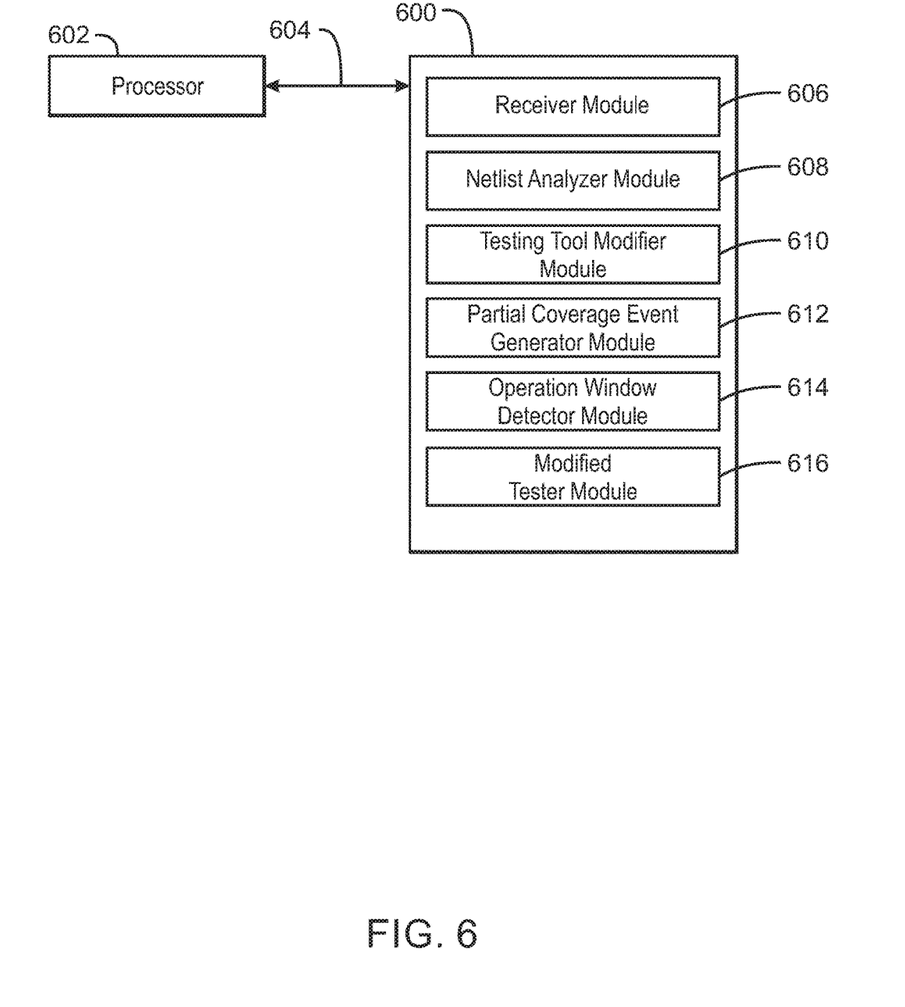
FIG. 6 is an example tangible, non-transitory computer-readable medium that can identify singular independent signals using structural logic analysis.

Referring now to FIG. 6, a block diagram is depicted of an example tangible, non-transitory computer-readable medium 600 that can identify singular independent signals using structural logic analysis. The tangible, non-transitory, computer-readable medium 600 may be accessed by a processor 602 over a computer interconnect 604. Furthermore, the tangible, non-transitory, computer-readable medium 600 may include code to direct the processor 602 to perform the operations of the methods 400 and 500 of FIGS. 4 and 5 above.

The various software components discussed herein may be stored on the tangible, non-transitory, computer-readable medium 600, as indicated in FIG. 6. For example, a receiver module 606 includes code to receive a netlist including a complex coverage event that depends on at least one singular independent signal. For example, the singular independent signal may be an asynchronous interface signal. In some examples, the singular independent signal may be an interrupt. A netlist analyzer module 608 includes code to detect that the complex coverage event can be separated into the singular independent signal and a logic state based on a structural logic analysis. For example, the structural logic analysis may include determining a number of paths for each signal received at a counter and identifying signals with more than one path as part of the logic state. By contrast, signals with only one path may be identified as singular independent signals. In some examples, the netlist analyzer module 608 may include code to detect that the complex coverage event can be separated into a number of singular independent signals including the singular independent signal and a logic state based on the structural logic analysis. The testing tool modifier module 610 further includes code to modify a testing tool to test the netlist based on the singular independent signal. The partial coverage event generator module 612 also includes code to separate the singular independent signal from the logic state in the complex coverage event to generate a partial coverage event including the logic state. In some examples, the partial coverage event generator module 612 can separate a number of singular independent signals from the logic state the complex coverage event to generate a partial coverage event including the logic state. An operation window detector module 614 includes code to determine an operation window in which the singular independent signal effects the complex coverage event based on the partial coverage event. In some examples, the operation window detector module 614 may include code to determine one or more operation windows in which the plurality of singular independent signals effect the complex coverage event based on the partial coverage event. A modified tester module 616 also includes code to drive the singular independent signal at the operation window to simulate the complex coverage event. In some examples, the modified tester module 616 may include code to drive the plurality of singular independent signals at the one or more operation windows to simulate the complex coverage event.

It is to be understood that any number of additional software components not shown in FIG. 6 may be included within the tangible, non-transitory, computer-readable medium 600, depending on the particular application.

The flowchart and block diagrams in the Figures illustrate the architecture, functionality, and operation of possible implementations of systems, methods, and computer program products according to various embodiments of the present techniques. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. It is to be understood that any number of additional software components not shown in FIG. 6 may be included within the tangible, non-transitory, computer-readable medium 600, depending on the specific application.

The descriptions of the various embodiments of the present techniques have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising a processor to:
   receive a netlist comprising a complex coverage event that depends on at least one singular independent signal;
   detect that the complex coverage event can be separated into the singular independent signal and a logic state based on a structural logic analysis; and
   test the netlist based on the singular independent signal.

2. The system of claim 1, wherein the processor is to separate the singular independent signal from the logic state in the complex coverage event to generate a partial coverage event comprising the logic state.

3. The system of claim 2, wherein the processor is to determine an operation window in which the singular independent signal effects the complex coverage event based on the partial coverage event.

4. The system of claim 3, wherein the processor is to drive the singular independent signal at the operation window to simulate the complex coverage event.

5. The system of claim 1, wherein the processor is to:
   detect that the complex coverage event can be separated into a plurality of singular independent signals including the singular independent signal and the logic state based on the structural logic analysis;
   separate the plurality of singular independent signals from the logic state in the complex coverage event to generate a partial coverage event comprising the logic state;
   determine one or more operation windows in which the plurality of singular independent signals effect the complex coverage event based on the partial coverage event; and
   drive the plurality of singular independent signals at the one or more operation windows to simulate the complex coverage event.

6. The system of claim 1, wherein the singular independent signal comprises an asynchronous interface signal.

7. The system of claim 1, wherein the singular independent signal comprises an interrupt.

8. A computer-implemented method, comprising:
   receiving, via a processor, a netlist comprising a complex coverage event that depends on a singular independent signal;
   detecting, via the processor, that complex coverage event can be separated into the singular independent signal and a logic state based on a structural logic analysis; and
   testing, via the processor, the netlist based on the singular independent signal.

9. The computer-implemented method of claim 8, comprising separating, via the processor, the singular independent signal from the complex coverage event to generate a partial coverage event comprising the logic state.

10. The computer-implemented method of claim 9, comprising determining, via the processor, an operation window in which the singular independent signal effects the complex coverage event based on the partial coverage event.

11. The computer-implemented method of claim 10, comprising driving, via the processor, the singular independent signal at the operation window to simulate the complex coverage event.

12. The computer-implemented method of claim 9, comprising:
   detecting, via the processor, that the complex coverage event can be separated into a plurality of singular independent signals including the singular independent signal and the logic state based on the structural logic analysis;
   extracting, via the processor, the plurality of singular independent signals to generate the partial coverage event comprising the logic state;
   determining, via the processor, one or more operation windows in which the plurality of singular independent signals effect the complex coverage event based on the partial coverage event; and
   driving, via the processor, the plurality of singular independent signals at the one or more operation windows to simulate the complex coverage event.

13. The computer-implemented method of claim 8, comprising analyzing coverage holes in the netlist to identify complex coverage events that depend on asynchronous interface signals.

14. The computer-implemented method of claim 8, wherein the structural logic analysis comprises determining a number of paths for each signal received at a counter and identifying signals with more than one path as part of the logic state.

15. A computer program product comprising a computer-readable storage medium having program code embodied therewith, wherein the computer readable storage medium is not a transitory signal per se, the program code executable by a processor to cause the processor to:
   receive a netlist comprising a complex coverage event that depends on a singular independent signal;
   detect that complex coverage event can be separated into the singular independent signal and a logic state based on a structural logic analysis; and
   test the netlist based on the singular independent signal.

16. The computer program product of claim 15, comprising program code executable by the processor to separate the singular independent signal from the complex coverage event to generate a partial coverage event comprising the logic state.

17. The computer program product of claim 16, comprising program code executable by the processor to determine an operation window in which the singular independent signal effects a hard-to-hit coverage event based on the partial coverage event.

18. The computer program product of claim 17, comprising program code executable by the processor to drive the singular independent signal at the operation window to simulate the hard-to-hit coverage event.

19. The computer program product of claim 16, comprising program code executable by the processor to:
   detect that the complex coverage event can be separated into a plurality of singular independent signals including the singular independent signal and the logic state based on the structural logic analysis;
   separate the plurality of singular independent signals from the logic state to generate the partial coverage event comprising the logic state;
   determine one or more operation windows in which the plurality of singular independent signals effect the complex coverage event based on the partial coverage event; and
   drive the plurality of singular independent signals at the one or more operation windows to simulate the complex coverage event.

20. The computer program product of claim 15, comprising program code executable by the processor to determine a number of paths for each signal received at a counter and identifying signals with more than one path as part of the logic state.

* * * * *